(12) United States Patent
Kyung

(10) Patent No.: US 7,765,442 B2
(45) Date of Patent: Jul. 27, 2010

(54) MEMORY DEVICE TESTABLE WITHOUT USING DATA AND DATALESS TEST METHOD

(75) Inventor: Kye-Hyun Kyung, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 331 days.

(21) Appl. No.: 11/834,502

(22) Filed: Aug. 6, 2007

(65) Prior Publication Data

US 2008/0052570 A1 Feb. 28, 2008

(30) Foreign Application Priority Data

Aug. 28, 2006 (KR) .................. 10-2006-0081838

(51) Int. Cl.
*G11C 29/00* (2006.01)

(52) U.S. Cl. ...................... 714/719; 714/733

(58) Field of Classification Search .............. 365/200; 714/729, 733, 738, 739, 744, 719
See application file for complete search history.

(56) References Cited

U.S. PATENT DOCUMENTS

| 5,592,493 | A | * | 1/1997 | Crouch et al. ............. 714/729 |
| 5,740,098 | A | | 4/1998 | Adams et al. |
| 7,010,736 | B1 | * | 3/2006 | Teh et al. ................. 714/733 |
| 7,213,185 | B2 | * | 5/2007 | Barone et al. ............. 714/733 |
| 2001/0024390 | A1 | * | 9/2001 | Fukuda .................... 365/200 |
| 2004/0107396 | A1 | * | 6/2004 | Barone et al. ............. 714/733 |

FOREIGN PATENT DOCUMENTS

| JP | 62-170100 | 7/1987 |
| JP | 04-147500 | 5/1992 |
| JP | 05-342900 | 12/1993 |
| JP | 2003-084044 | 3/2003 |
| KR | 1997-008212 | 2/1997 |

OTHER PUBLICATIONS

English language abstract of Korean Publication No. 1997-008212.
English language abstract of Japanese Publication No. 05-342900.
English language abstract of Japanese Publication No. 2003-084044.

* cited by examiner

*Primary Examiner*—David Ton
(74) *Attorney, Agent, or Firm*—Muir Patent Consulting, PLLC

(57) ABSTRACT

Example embodiments of the present invention include a memory device testable without using data and a dataless test method. The memory device includes a plurality of registers to store test patterns, the registers being coupled to input/output DQ pads. The test patterns are stored in the registers when a mode register of the memory device is set. The memory device transfers the test patterns to a DQ pad responsive to a write test signal, and transfers the test patterns from the DQ pad to a data input buffer responsive to a read test signal. The memory device writes the test patterns transferred to the data input buffer to memory cells. The memory device reads data stored in the memory cells responsive to the write test signal and transfers the memory cell data from the DQ pad to a comparator responsive to the read test signal. The memory device compares the test patterns to the memory cell data transferred to the comparator and generates an indicator signal to indicate the comparison result.

25 Claims, 4 Drawing Sheets

MEMORY DEVICE TESTABLE WITHOUT USING DATA AND DATALESS TEST METHOD

CROSS-REFERENCE TO RELATED PATENT APPLICATION

This application claims the benefit of Korean Patent Application No. 10-2006-0081838, filed on Aug. 28, 2006, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a memory device that can be tested without using data and a dataless test method.

2. Description of the Related Art

As memory devices are highly integrated and production scale of the memory devices continually increases, demand for testers which can carry out parallel tests for large-capacity memory devices also increases. However, the number of test dies of the tester is limited because the number of test signals corresponding to the number of signals of a memory device is limited.

Furthermore, as the operating frequencies of memory devices increase, a high-speed tester is required. In the case of 512M DDR2 DRAM, for example, the total number of signals of a tester used to test a single DDR2 DRAM is forty-eight, which includes twenty-six command/address signals, two clock signals and twenty data signals. To test the DDR2 DRAM, the data signals have to be applied to the DDR2 DRAM at a high operating frequency while the command/address signals can be applied to the DDR2 DRAM at a frequency corresponding to half the high operating frequency of the DDR2 DRAM. Accordingly, when the DDR2 DRAM is tested using a high-speed tester, the number of test dies capable of performing a parallel test is determined (e.g., limited) by the number of data signals.

Therefore, a need exists for a test method and a test device which does not restrict the number of parallel test dies. A need also exists for a test method and a test device which does not provide data signals that restrict the number of parallel test dies. Finally, a need exists for a test method and a test device where a tested DRAM provides fewer data signals to increase the number of parallel test dies required to test the DRAM.

SUMMARY OF THE INVENTION

Example embodiments of the present invention include a memory device testable without using data and a dataless test method.

In one example embodiment of the present invention, a memory device comprises a plurality of memory cells, a plurality of registers configured to store test patterns, at least one input/output pad, a switching device configured to transmit to the at least one input/output pad one of (a) at least one test pattern and (b) data of the memory cells, and a buffer configured to receive from the at least one input/output pad the at least one test pattern and the data of the memory cells, to transmit the at least one test pattern to the memory cells, and to transmit the data of the memory cells to a comparator.

Another example embodiment of the present invention includes a memory test system comprising a memory device configured to store test patterns in a plurality of registers, to transmit at least one of the test patterns to a plurality of memory cells, and to compare data of the memory cells to expected data, and a tester configured to transmit at least one clock signal, a data mask, and a plurality of command signals to the memory device and to receive a test result as an indicator signal from the memory device.

In yet another example embodiment of the present invention, a method of testing a memory device comprises storing test patterns in a plurality of registers of the memory device, transmitting the test patterns to an input/output pad, transmitting the test patterns from the input/output pad to a buffer, writing the test patterns to a plurality of memory cells, reading data stored in the memory cells, transmitting the data to the input/output pad, transmitting the data from the input/output pad to a comparator, and comparing the data of the memory cells to expected data stored in the memory device.

Accordingly, the memory device shown in various example embodiments of the present invention may receive a test pattern from at least one of the internal data pattern registers. In some example embodiments, the need to apply data signals to the tester is obviated. In other example embodiments, the data signal lines are reduced or eliminated. As a result, the number of memory devices that can be coupled to the tester is increased. Furthermore, the number of parallel test dies is increased, which in turn improves test efficiency.

BRIEF DESCRIPTION OF THE DRAWINGS

The foregoing and other features, objects, and advantages of example embodiments of the present invention will become more readily apparent from the following detailed description, which proceeds with reference to the accompanying drawings in which.

DETAILED DESCRIPTION OF THE INVENTION

Figure 1A:
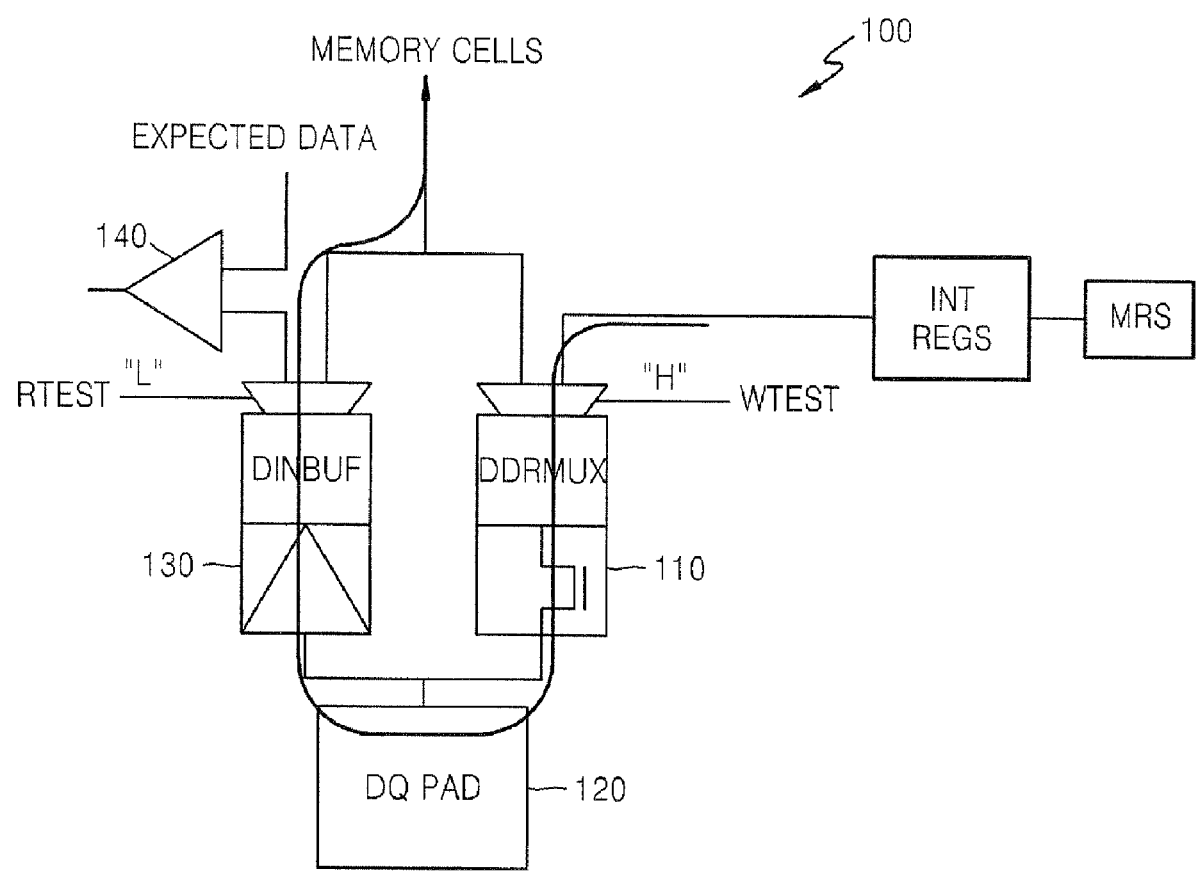
FIGS. 1A and 1B respectively illustrate a write test operation and a read test operation of a memory device according to an example embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 1B:
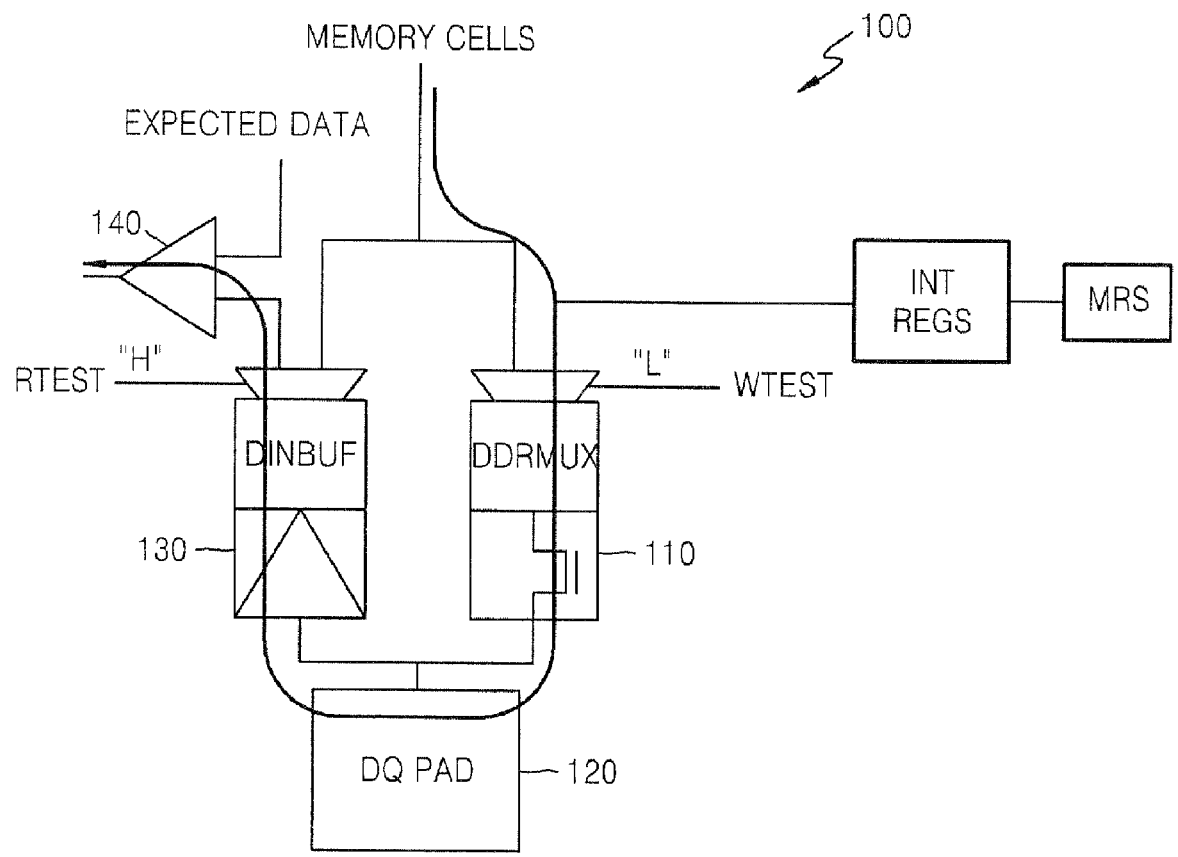

FIGS. 1A and 1B illustrate a memory device 100 according to an example embodiment of the present invention. FIG. 1A illustrates a write test operation of the memory device 100 and FIG. 1B illustrates a read test operation of the memory device 100.

Referring to FIG. 1A, the memory device 100 may include a multiplexer 110, a data input/output (DQ) pad 120, a data input buffer 130, and a comparator 140. The multiplexer 110 may receive a test pattern responsive to a write test signal WTEST at a logic high level "H" and may transfer the test pattern to the DQ pad 120. The data input buffer 130 may receive the test pattern transferred to the DQ pad 120 responsive to a read test signal RTEST at a logic low level "L". Then, the test pattern may be written to memory cells of the memory device 100.

The test pattern may be stored in internal registers INT REGS of the memory device 100. The internal registers may, for example, be sixteen data pattern registers. A data pattern and the type of the data pattern may be programmed in the data pattern registers for each programming operation, and may be characterized by mode register settings MRS of the memory device 100. For example, when the memory device 100 includes sixteen DQ pads, the number of programming operations of the data pattern registers may correspond to 16 DQ×16 registers/(8-bit/MRS)=32 MRS. Accordingly, the memory device 100 may store the test pattern in the data pattern registers through thirty-two MRS programming operations. In reality, the memory device 100 may perform thirty-three MRS programming operations including an initial MRS programming operation. The test patterns stored in the sixteen data pattern registers may be sequentially used whenever the write test operation of the memory device 100 is carried out.

The memory device 100 may program a data pattern and the type of the data pattern in only a part of the data pattern registers. Accordingly, the memory device can repeatedly use the data pattern registers storing the data pattern.

Referring to FIG. 1B, memory cell data (data written to the memory cells) may be transferred to the DQ pad 120 through the multiplexer 110 operating responsive to the write test signal WTEST at a logic low level "L". The data input buffer 130 may transfer the memory cell data from the DQ pad 120 to the comparator 140 responsive to the read test signal RTEST at a logic high level "H". The comparator 140 may compare expected data (e.g., the test pattern) to the memory cell data. The memory device 100 may indicate a "PASS" when the expected data corresponds to the memory cell data. Conversely, the memory device 100 may indicate a "FAIL" when the expected data does not correspond to the memory cell data. The write test operation and the read test operation can be applied to a normal mode, a parallel bit test mode, and a single data rate mode of the memory device 100.

Figure 2:
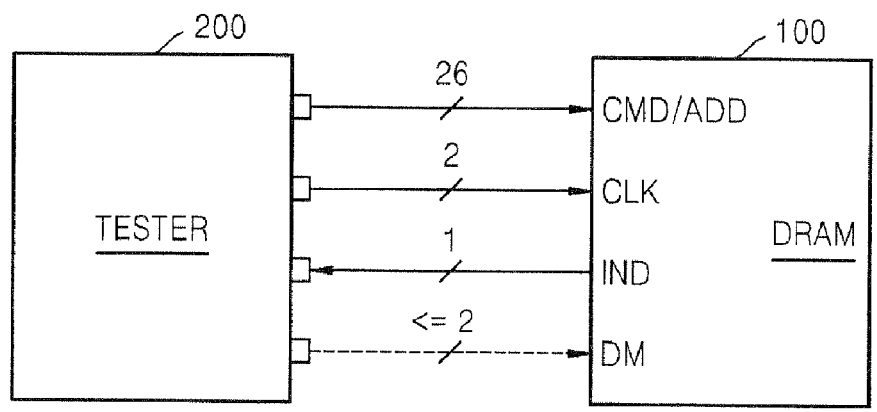
FIG. 2 illustrates a connection of the memory device illustrated in FIG. 1 and a tester.

FIG. 2 illustrates a connection of the memory device 100 to a tester 200. Referring to FIG. 2, the tester 200 may transmit command/address signals CMD/ADDR to the memory device 100 through twenty-six signal lines and may transmit a clock signal CLK to the memory device 100 through two clock signal lines. The tester 200 may receive an indicator signal IND transmitted from the memory device 100. In this example embodiment, data signals are not transmitted between the tester 200 and the memory device 100. The tester 200 can use two or less signal lines to transmit a data mask DM to the memory device 100.

The command/address signals CMD/ADDR and the clock signal CLK may be transmitted from the tester 200 in order to test a write operation and a read operation of the memory device 100. The indicator signal IND may be transmitted from the memory device 100 to transfer information about an error generated in the read operation of the memory device 100 to the tester 200.

Figure 3:
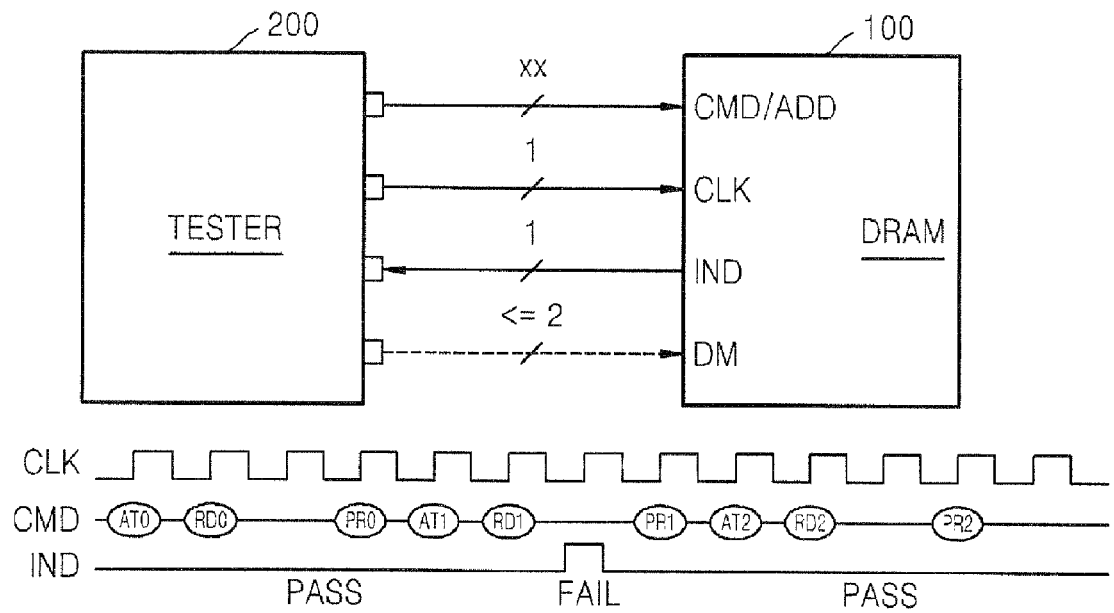
FIGS. 3, 4, and 5 illustrate methods of transmitting information about an error generated in a write test operation and a read test operation of a memory device according to various example embodiments of the present invention.
Figure 4:
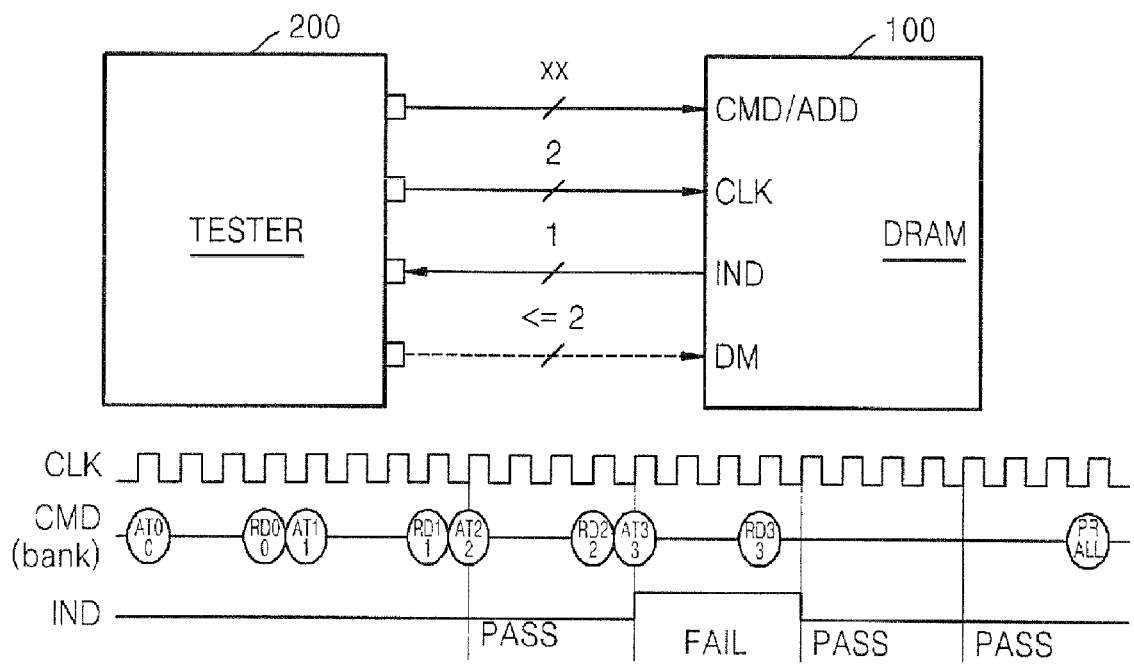
Figure 5:
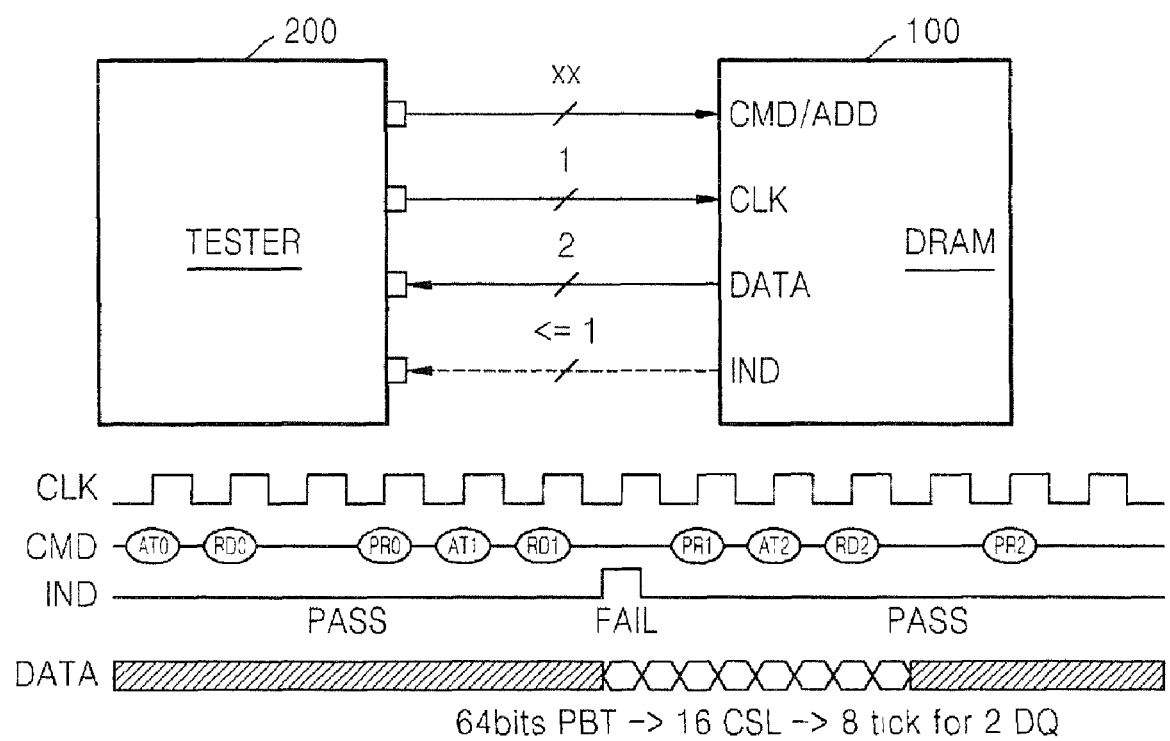

FIGS. 3, 4, and 5 illustrate methods of transmitting information about an error generated in the write test operation and the read test operation of the memory device.

Referring to FIG. 3, a plurality of command/address signal lines CMD/ADD, a single clock signal line CLK, and a single indicator signal line IND may be coupled between the tester 200 and the memory device 100. The memory device 100 may be tested responsive to a clock signal CLK and commands. For example, the plurality of command/address signal lines CMD/ADD may transmit an active command AT, a read command RD, and a precharge command PR. When the result obtained by testing the memory device 100—responsive to a first command group AT0, RD0, and PR0 by the tester 200— is "PASS," the memory device 100 may generate the indicator signal IND at a logic low level "L". When the result obtained by testing the memory device 100—responsive to a second command group AT1, RD1, and PR1—is "FAIL," the memory device 100 may generate the indicator signal IND at a logic high level "H". The indicator signal IND may be generated for one clock cycle of the clock signal CLK.

Referring to FIG. 4, the indicator signal IND representing a "FAIL" may be generated for a predefined plurality of clock cycles of the clock signal CLK, as further explained below. A plurality of command/address signal lines CMD/ADD, two clock signal lines CLK, a single indicator signal line IND, and two or less data masking lines DM may be coupled between the tester 200 and the memory device 100. The memory device 100 may be tested responsive to the clock signal CLK, an active command AT, and a read command RD for predefined banks of the memory device 100. When the result obtained by testing a first bank of the memory device 100— responsive to a first command group AT0 and RD0—is "PASS," the memory device 100 may generate the indicator signal IND at a logic low level "L". When the result obtained by testing a second bank of the memory device 100—responsive to a second command group AT1 and RD1—is "FAIL," the memory device 100 may generate the indicator signal IND at a logic high level "H" for clock cycles of the clock signal CLK corresponding to a period which may have the same length as the period between the third read command RD2 and a fourth read command RD3. When the result obtained by testing a third bank of the memory device 100— responsive to a third command group AT2 and RD2—is "PASS," the memory device 100 may generate the indicator signal IND at a logic low level "L". Similarly, when the result obtained by testing a fourth bank of the memory device 100— responsive to a fourth command group AT3 and RD3—is "PASS," the memory device 100 may generate the indicator signal IND at a logic low level "L".

Referring to FIG. 5, when address information of a defective memory cell of the memory device 100 is needed, the memory device 100 may transmit address information of the defective memory cell to the tester 200. In this case, a plurality of command/address signal lines CMD/ADD, a single clock signal line CLK, two data signal lines DATA, and a single indicator signal line IND may be coupled between the tester 200 and the memory device 100. When the result obtained by parallel-bit-testing the memory device 100— responsive to a second active command AT1 and a second read command RD1—is "FAIL," the memory device 100 may generate the indicator signal IND at a logic high level "H" for a single clock cycle of the clock signal CLK. An example embodiment of the present invention may include a 64-bit parallel bit test PBT of the memory device 100. In this example embodiment, information about sixteen column select signals CSL is required (e.g., 4 bits correspond to a single column select signal CSL). It may be required to inform the tester 200 which one of the sixteen column select signals corresponds to a defective memory cell. Accordingly, identifying information about the column select lines CSL corresponding to a defective memory cell may be transmitted using one or both of the data signal lines DATA—an example embodiment of which is illustrated in FIG. 5.

Accordingly, the memory device shown in various example embodiments of the present invention may receive a test pattern from at least one of the internal data pattern registers. In some example embodiments, the need to apply data signals to the tester is obviated. In other example embodiments, the data signal lines are reduced or eliminated. As a result, the number of memory devices that can be coupled to the tester is increased. Furthermore, the number of parallel test dies is increased, which in turn improves test efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
   a plurality of memory cells;
   a plurality of registers configured to store test patterns;
   at least one input/output pad;
   a switching device configured to transmit to the at least one input/output pad data read from the memory cells, and at least one of the test patterns; and
   a buffer configured to receive, through the at least one input/output pad, the at least one of the test patterns and the data read from the memory cells, to transmit the at least one of the test patterns to the memory cells, and to transmit the data read from the memory cells to a comparator.

2. The memory device of claim 1, wherein the comparator is configured to compare the data of the memory cells to expected data.

3. The memory device of claim 2, wherein the expected data corresponds to the test patterns.

4. The memory device of claim 1, wherein the switching device operates responsive to a write test signal and the buffer operates responsive to a read test signal.

5. The memory device of claim 1, wherein the test patterns are stored in at least some of the plurality of registers responsive to at least one mode register setting (MRS) programming operation.

6. A memory test system comprising:
   a memory device configured to store test patterns in a plurality of registers, to transmit at least one of the test patterns through at least one input/output pad to a plurality of memory cells, and to compare data read from the memory cells and received through the at least one input/output pad to expected data; and
   a tester configured to transmit at least one clock signal, a data mask, and a plurality of command signals to the memory device and to receive a test result as an indicator signal from the memory device,
   wherein the test patterns are stored in the plurality of registers responsive to at least one mode register setting (MRS), and
   wherein the at least one input/output pad is a data input/output pad of the memory device for transmitting data outside the memory device.

7. The memory test system of claim 6, wherein no data signals are transmitted between the tester and the memory device.

8. The memory test system of claim 7, wherein data signal lines are coupled to at least one input/output pad of the memory device and are not coupled to the tester.

9. The memory test system of claim 6,
   wherein at least one data signal line is coupled between the memory device and the tester to transmit information about a defective memory cell of the memory device.

10. The memory test system of claim 9, wherein two or less data signal lines are coupled between the memory device and the tester to transmit at least one column select signal corresponding with the defective memory cell.

11. The memory test system of claim 10, wherein sixteen column select signals corresponding to a 64-bit parallel bit test PBT are transmitted through the two or less data signal lines.

12. The memory test system of claim 6, wherein the indicator signal is generated for one clock cycle.

13. The memory test system of claim 6, wherein the indicator signal is generated for a period having substantially a same length as a period between a first and second read command.

14. The memory test system of claim 6, wherein the memory device comprises:
   a multiplexer configured to transmit to the at least one input/output pad the at least one of the test patterns and the data read from the memory cells; and
   a buffer configured to receive from the at least one input/output pad the at least one of the test patterns and the data read from the memory cells, to transmit the at least one of the test patterns to the memory cells, and to transmit the data read from the memory cells to a comparator.

15. A method of testing a memory device comprising:
   storing test patterns in a plurality of registers of the memory device;
   transmitting the test patterns to an input/output pad;
   transmitting the test patterns from the input/output pad to a buffer;
   writing the test patterns to a plurality of memory cells;
   reading data stored in the memory cells;
   transmitting the data to the input/output pad;
   transmitting the data from the input/output pad to a comparator through the buffer; and
   comparing the data of the memory cells to expected data stored in the memory device,
   wherein the at least one input/output pad is a data input/output pad of the memory device configured to transmit data outside the memory device.

16. The method of claim 15, wherein the expected data corresponds to the test patterns.

17. The method of claim 15, wherein the test patterns are stored in at least some of the plurality of registers responsive to at least one mode register setting (MRS) programming operation.

18. The method of claim 15, wherein at least one clock signal, a data mask, and a plurality of command signals are transmitted between a tester and the memory device.

19. The method of claim 18, wherein no data signals are transmitted between the tester and the memory device.

20. The method of claim 19, wherein data signal lines are coupled to the input/output pad and are not coupled to the tester.

21. The method of claim 18, wherein information about a defective memory cell of the memory device is transmitted over at least one data signal line which is coupled between the memory device and the tester.

22. The method of claim 21, wherein at least one column select signal corresponding with the defective memory cell is transmitted over two or less data signal lines which are coupled between the memory device and the tester.

23. The method of claim 22, wherein sixteen column select signals corresponding to a 64-bit parallel bit test PBT are transmitted through the two or less data signal lines.

24. The memory test system of claim 18, wherein an indicator signal is generated for one clock cycle and transmitted between the tester and the memory device.

25. The memory test system of claim 24, wherein the indicator signal is generated for a period having substantially a same length as a period between a first and second read command.

* * * * *